(12) United States Patent
Yang

(10) Patent No.: US 11,609,453 B2
(45) Date of Patent: Mar. 21, 2023

(54) LIGHT SOURCE ASSEMBLY, DISPLAY MODULE AND METHOD OF MANUFACTURING LIGHT SOURCE ASSEMBLY

(71) Applicants: Beijing BOE Display Technology Co., Ltd., Beijing (CN); BOE Technology Group Co., Ltd., Beijing (CN)

(72) Inventor: Song Yang, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/364,645

(22) Filed: Jun. 30, 2021

(65) Prior Publication Data

US 2022/0091462 A1 Mar. 24, 2022

(30) Foreign Application Priority Data

Sep. 24, 2020 (CN) .......................... 202011019998.1

(51) Int. Cl.
*G02F 1/13357* (2006.01)
*G02F 1/1335* (2006.01)
*H01L 33/54* (2010.01)
*H01L 25/075* (2006.01)
*G02F 1/1677* (2019.01)

(52) U.S. Cl.
CPC .. *G02F 1/133603* (2013.01); *G02F 1/133502* (2013.01); *G02F 1/133612* (2021.01); *H01L 25/0753* (2013.01); *H01L 33/54* (2013.01); *G02F 1/133528* (2013.01); *G02F 1/1677* (2019.01); *G02F 2203/02* (2013.01)

(58) Field of Classification Search
CPC ......... G02F 1/133603; G02F 1/133502; G02F 1/133612; G02F 1/133528; G02F 1/1677; G02F 2203/02; H01L 25/0753; H01L 33/54
See application file for complete search history.

(56) References Cited

U.S. PATENT DOCUMENTS

| 10,750,060 | B2 * | 8/2020 | Iwafuchi | H04N 5/3572 |
| 11,393,880 | B2 * | 7/2022 | Jang | H01L 51/56 |
| 2014/0061684 | A1 * | 3/2014 | Marutani | H01L 33/62 |
| | | | | 438/28 |
| 2019/0079340 | A1 * | 3/2019 | Cheng | G02F 1/133553 |
| 2019/0265541 | A1 * | 8/2019 | Nakamura | G03B 21/006 |
| 2019/0363226 | A1 * | 11/2019 | Musashi | H01L 33/58 |
| 2020/0185453 | A1 * | 6/2020 | Cho | H01L 33/44 |
| 2020/0244946 | A1 * | 7/2020 | Wang | G02B 30/32 |

(Continued)

FOREIGN PATENT DOCUMENTS

CN 111384141 A * 7/2020
JP 2007531320 A * 11/2007

*Primary Examiner* — Tracie Y Green
(74) *Attorney, Agent, or Firm* — IPro, PLLC

(57) ABSTRACT

A light source assembly, includes: a substrate; a first light-blocking pattern disposed on the substrate; a first light-emitting unit disposed on the first light-blocking pattern; and an encapsulation portion disposed on the substrate and enveloping the first light-blocking pattern and the first light-emitting unit; wherein an outer surface of the encapsulation portion is a curved surface. A display module and a method of manufacturing the light source module are further provided.

20 Claims, 5 Drawing Sheets

(56) References Cited

U.S. PATENT DOCUMENTS

| | | | |
|---|---|---|---|
| 2020/0371397 A1* | 11/2020 | An | G02B 5/28 |
| 2021/0082883 A1* | 3/2021 | Yang | H01L 33/54 |
| 2021/0226106 A1* | 7/2021 | Yun | H01L 33/405 |
| 2021/0335761 A1* | 10/2021 | Huang | H01L 27/3293 |

* cited by examiner

LIGHT SOURCE ASSEMBLY, DISPLAY MODULE AND METHOD OF MANUFACTURING LIGHT SOURCE ASSEMBLY

CROSS REFERENCES TO RELATED APPLICATIONS

This disclosure claims the priority of Chinese patent application CN 202011019998.1 entitled "Light Source Assembly, Display Module and Method of Manufacturing Light Source Assembly" and filed with National Intellectual Property Administration, P. R. C. on Sep. 24, 2020, contents of which is incorporated herein by reference in entirety for all purpose.

TECHNICAL FIELD

Embodiments of the present disclosure relate to a light source assembly, a display module, and a method of manufacturing the light source assembly.

BACKGROUND

A reflective display screen is a display screen in which a reflective material is disposed under a liquid crystal panel to reflect ambient light to achieve display. In the case of sufficient ambient light, the reflective material reflects light entering the display screen, and the reflected light illuminates the display screen to achieve display. At the same time, in order to avoid the problem that the display screen cannot be illuminated in a case of insufficient light, a front light source is also provided in the reflective display screen. When the ambient light is insufficient, the front light source can be turned on to illuminate the display screen. In a manufacturing process of the reflective display screen, the front light source and the display panel cannot be fully adhered with each other, which easily results in poor display.

SUMMARY

At least one embodiment of the present disclosure provides a light source assembly, including: a substrate; a first light-blocking pattern disposed on the substrate; a first light-emitting unit disposed on the first light-blocking pattern; and an encapsulation portion disposed on the substrate and enveloping the first light-blocking pattern and the first light-emitting unit; wherein an outer surface of the encapsulation portion is a curved surface.

In some embodiments of the present disclosure, the light source assembly is applicable to a reflective display module.

In some embodiments of the present disclosure, orthographic projections of the first light-blocking pattern and the first light-emitting unit on the substrate are located within an orthographic projection of the encapsulation portion on the substrate.

In some embodiments of the present disclosure, the curved surface is a hemispherical surface or a spherical crown surface.

In some embodiments of the present disclosure, an orthographic projection of the first light-emitting unit on the substrate is located within an orthographic projection of the first light-blocking pattern on the substrate, and an angle between light that is emitted by the first light-emitting unit towards the substrate and is blocked by an edge of the first light-blocking pattern and a central axis of the first light-emitting unit is not less than 42°.

In some embodiments of the present disclosure, the first light-emitting unit includes three light-emitting sub-units of different colors, and a distance between two adjacent light-emitting sub-units of the first light-emitting unit ranges from 40 μm to 120 μm.

In some embodiments of the present disclosure, the first light-emitting unit is a white light micro LED.

In some embodiments of the present disclosure, the light source assembly further includes a first wiring disposed on the substrate, wherein the first wiring is connected to the first light-emitting unit, and the first wiring is made of a transparent conductive material.

In some embodiments of the present disclosure, the light source assembly further includes: a second light-blocking pattern disposed on the substrate, wherein an orthographic projection of the second light-blocking pattern on the substrate is spaced apart from an orthographic projection of the first light-blocking pattern on the substrate; and a second wiring disposed on the second light-blocking pattern, wherein the second wiring is made of a metal material and is connected to the first light-emitting unit.

In some embodiments of the present disclosure, a refractive index of the encapsulation portion ranges from 1.4 to 1.6.

In some embodiments of the present disclosure, there are a plurality of the first light-blocking patterns, the plurality of first light-blocking patterns are arranged in array on the substrate, and there are a plurality of the first light-emitting units, the plurality of first light-emitting units correspond to the plurality of first light-blocking patterns in one-to-one correspondence, and there are a plurality of the encapsulation portions and the plurality of encapsulation portions correspond to the plurality of first light-blocking patterns in one-to-one correspondence.

In some embodiments of the present disclosure, each of the plurality of first light-emitting units comprises a red light-emitting sub-unit, a green light-emitting sub-unit, and a blue light-emitting sub-unit, and a distance between two light-emitting sub-units with a same color of two adjacent first light-emitting units ranges from 120 μm to 360 μm.

At least one embodiment of the present disclosure provides a display module, including: a reflective panel; and the light source assembly as described above; wherein the light source assembly and the reflective panel are bonded by an adhesive layer, and the first light-emitting unit is located between the reflective panel and the substrate.

In some embodiments of the present disclosure, the reflective panel is a reflective electronic ink screen.

In some embodiments of the present disclosure, the reflective panel is a reflective LCD, and the display module further includes: an anti-reflection polarizer stacked with the substrate and disposed on a side of the substrate away from the first light-blocking pattern, wherein a polarization direction of the anti-reflection polarizer is same as a polarization direction of the reflective LCD.

In some embodiments of the present disclosure, a refractive index of the adhesive layer ranges from 1.4 to 1.6.

In some embodiments of the present disclosure, a refractive index of the encapsulation portion is equal to the refractive index of the adhesive layer.

At least one embodiment of the present disclosure provides a method of manufacturing a light source assembly, including: forming a first light-blocking pattern on a substrate; forming a first light-emitting unit on the first light-blocking pattern; spin-coating an encapsulation material on surfaces of the first light-blocking pattern and the first light-emitting unit to form a basic encapsulation layer;

patterning the basic encapsulation layer to form an encapsulation embryonic portion; and processing an outer surface of the encapsulation embryonic portion by a reflow process to form an encapsulation portion, wherein an outer surface of the encapsulation portion is a curved surface.

In some embodiments of the present disclosure, spin-coating the encapsulation material on the surfaces of the first light-blocking pattern and the first light-emitting unit is performed in a vacuum environment.

In some embodiments of the present disclosure, the encapsulation embryonic portion has one structure of a cylindrical encapsulation structure and a truncated cone-shaped encapsulation structure.

Additional aspects and advantages of the present disclosure will be partially given in the following description, and some will become obvious from the following description, or be understood through the practice of the present disclosure.

REFERENCE SIGNS

Figure 1:
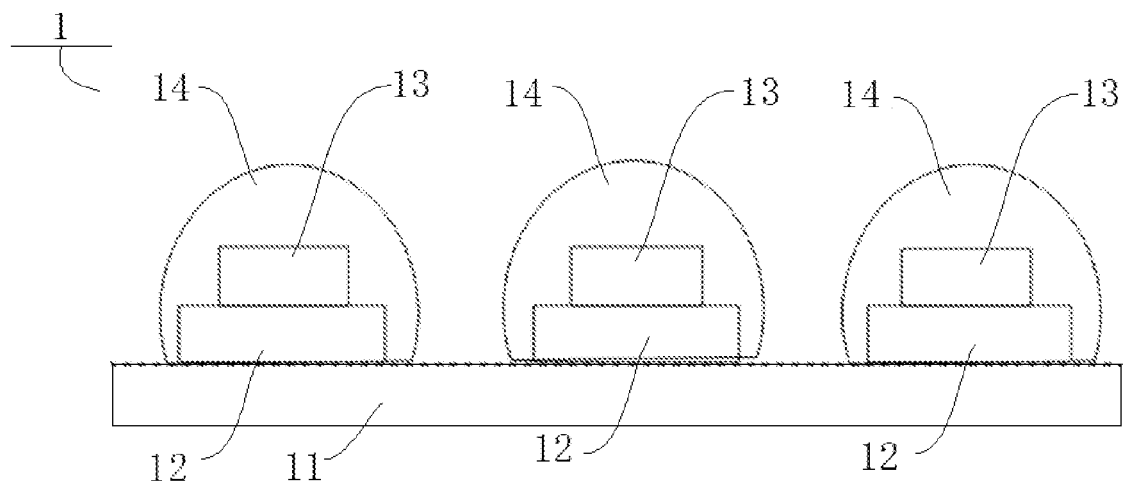
FIG. 1 illustrates a schematic structural view of a light source assembly according to an embodiment of the present disclosure.

Display Module 100
Light Source Assembly 1
Substrate 11
First Light-Blocking Pattern 12
First Light-Emitting Unit 13
Light-Emitting Sub-Unit R131
Light-Emitting Sub-Unit G132
Light-Emitting Sub-Unit B133
Encapsulation Portion 14
Second Light-Blocking Pattern 15
Wiring 16
Basic Encapsulation Layer 17
Encapsulation Embryonic Portion 18
Reflective Panel 2
Anti-Reflection Polarizer 3
Adhesive Layer 4

DETAILED DESCRIPTION OF THE EMBODIMENTS

The embodiments of the present disclosure are described in detail hereinafter. Examples of the embodiments are illustrated in the accompanying drawings, in which the same or similar reference signs designate the same or similar elements or elements with the same or similar functions. The embodiments described below with reference to the drawings are exemplary, and are intended to explain the present disclosure, but should not be construed as a limit to the present disclosure.

The following disclosure provides many different embodiments or examples for achieving different structures of the present disclosure. In order to simplify the disclosure of the present disclosure, components and configurations of specific examples are described below. Of course, they are only exemplary, and are not intended to limit the present disclosure. In addition, the present disclosure may repeat reference signs and/or letters in different examples. This repetition is for the purpose of simplification and clarity, and does not indicate the relationship between the various embodiments and/or settings discussed. In addition, the present disclosure provides examples of various specific processes and materials, but one of ordinary skill in the art may be aware of the applicability of other processes and/or application of other materials.

In reflective display screens known by the inventor, a front light source is provided, and in the case of insufficient ambient light, the front light source is used to provide illumination to the reflective display screen for display. In a case that the front light source is adhered to the display panel through adhesive, due to uneven outer surface of the front light source, the front light source and the adhesive glue cannot be fully attached, and air bubbles are formed at the contact surface, resulting in display defects.

At least one embodiment of the present disclosure provides a light source assembly, the light source assembly is applicable to a reflective display screen, and includes: a substrate; a first light-blocking pattern stacked with the substrate; a first light-emitting unit stacked with the first light-blocking pattern and disposed on a side of the first light-blocking pattern away from the substrate; an encapsulation portion, enveloping the first light-blocking pattern and the first light-emitting unit therein, and an outer surface of the encapsulation portion being curved.

The light source assembly according to the embodiment of the present disclosure is applicable to a display module.

The light source assembly according to embodiments of the present disclosure will be described hereinafter with reference to the accompanying drawings.

Figure 2:
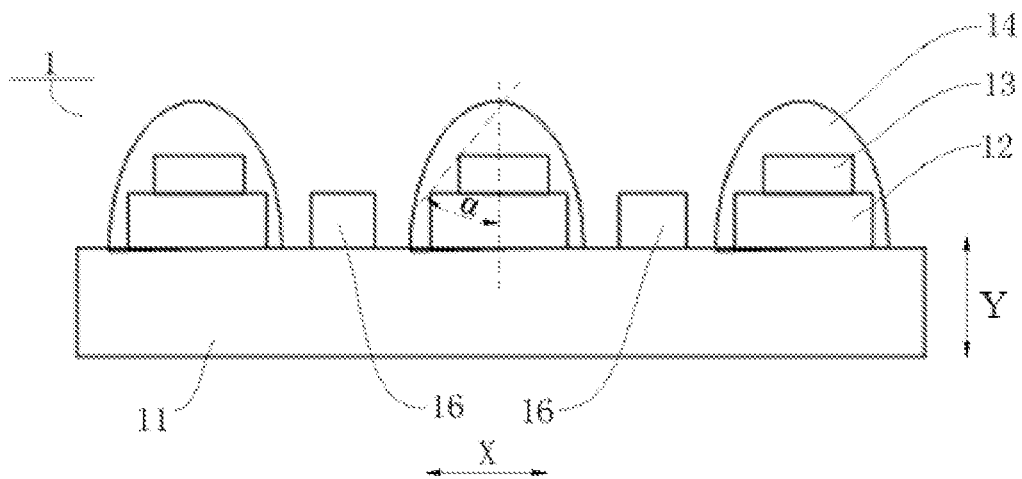
FIG. 2 illustrates a schematic structural view of a light source assembly according to another embodiment of the present disclosure.
Figure 3:
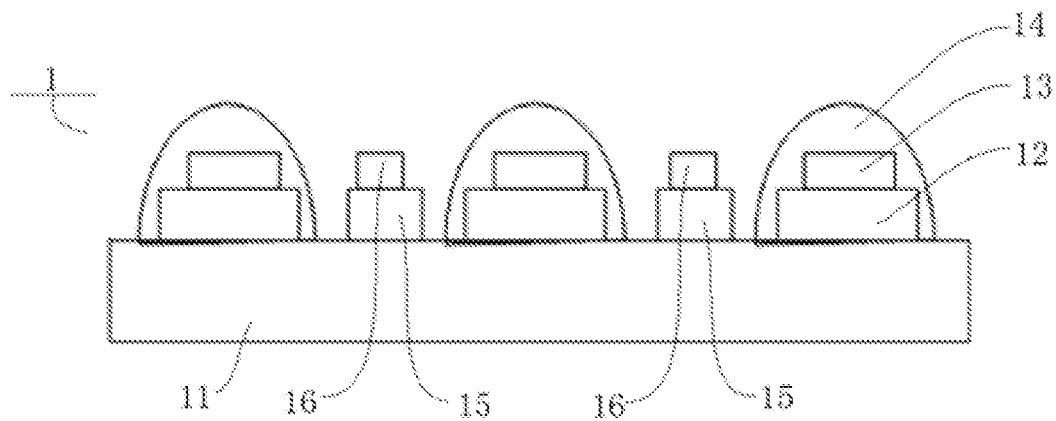
FIG. 3 illustrates a schematic structural view of a light source assembly according to still another embodiment of the present disclosure.

As illustrated in FIGS. 1 to 3, the light source assembly 1 according to an embodiment of the present disclosure includes: a substrate 11, a first light-blocking pattern 12, a first light-emitting unit 13 and an encapsulation portion 14.

As illustrated in FIG. 1, the first light-blocking pattern 12 and the substrate 11 are stacked with each other, the first light-emitting unit 13 and the first light-blocking pattern 12 are stacked with each other, and the first light-emitting unit 13 is disposed on a side of the first light-blocking pattern 12 away from the substrate 11. It should be understood that the first light-blocking pattern 12 is disposed between the first light-emitting unit 13 and the substrate 11, and is configured to block light emitted by the first light-emitting unit 13 towards the substrate, thus, light emitted by the first-emitting unit 13 can be prevented from leaking from the substrate 11. For example, the first light-blocking pattern 12 is formed into a black light-blocking layer, and the substrate 11 is a transparent element. In an embodiment of the present disclosure, the substrate 11 may be formed of glass or PI (Polyimide).

As illustrated in FIGS. 1 to 3, the first light-blocking pattern 12 and the first light-emitting unit 13 are enveloped in the encapsulation portion 14, and an outer surface of the encapsulation portion 14 is formed as a curved surface. It should be understood that, by providing the encapsulation portion 14 outside the first light-emitting unit 13 and the first light-blocking pattern 12, and the outer surface of the encapsulation portion 14 is formed as a curved surface, when subsequently combined with a reflective display panel, air bubbles are not prone to be present between the encapsulation portion 14 with a curved surface and the adhesive layer 4. Thus, defects of an assembled display module 100 are avoided, and display effect of the display module 100 is further improved.

In an embodiment of the present disclosure, the first light-emitting unit 13 may be a micro LED or a mini LED, and has a size in an order of about 1 μm to 10 μm.

In some embodiments of the present disclosure, as illustrated in FIGS. 1 to 3, the outer surface of the encapsulation portion 14 is formed into a hemispherical surface or a spherical crown surface. Therefore, a structure of the encapsulation portion 14 can be simplified, difficulty in manufacturing the encapsulation portion 14 can be reduced, the production efficiency of the encapsulation portion 14 can be improved, and the production cost of the encapsulation portion 14 can be reduced. It should be noted that the spherical crown surface is a part of the spherical surface, and in the direction perpendicular to the substrate 11, a height of the spherical crown surface is less than a radius of the spherical surface where it is located.

In some embodiments of the present disclosure, a refractive index of the encapsulation portion 14 is d1, and satisfies: 1.4≤d1≤1.6. It should be understood that setting the refractive index of the encapsulation portion 14 in a range from 1.4 to 1.6 can reduce a difference between the refractive index of the encapsulation portion 14 and a refractive index of the substrate 11, thereby providing a better display effect. The refractive index of the encapsulation part 14 can be selected according to the refractive index of the substrate 11. For example, the refractive index of the encapsulation portion 14 may be 1.42, 1.44, 1.46, 1.49, 1.51, 1.53, 1.55, 1.57, or 1.59.

In some embodiments of the present disclosure, as illustrated in FIG. 2, an orthographic projection of the first light-emitting unit 13 on the substrate 11 is located within an orthographic projection of the first light-blocking pattern 12 on the substrate 11, and the first light-blocking pattern 12 is applicable to block light emitted by the first light-emitting unit 13 toward the substrate 11, which has an included angle (α as illustrated in FIG. 2) with a central axis of the first light-emitting unit 13 less than or equal to 42°.

It should be understood that the first light-blocking pattern 12 is provided to prevent the light emitted by the first light-emitting unit 13 from directly irradiating the substrate 11 at a small incident angle. It should be noted that the light emitted by the first light-emitting unit 13 is directed at various directions. The substrate 11 has a certain refractive index, for light which has an included angle (α as illustrated in FIG. 2) with a central axis of the first light-emitting unit 13 greater than 42°, it cannot be refracted by the substrate 11 and it cannot escape from the substrate, so this part of the light will not leak from the substrate. The light that is prone to leak is the light which has an included angle with the central axis of the first light-emitting unit 13 less than or equal to 42°. By providing the first light-blocking pattern 12 with a great orthographic projection area on the substrate, the first light-blocking pattern 12 can be configured to block the light which is emitted by the first light-emitting unit 13 toward the substrate and has an included angle with the central axis of the first light-emitting unit 13 less than or equal to 42°, the light emitted by the first light-emitting unit 13 towards and directly irradiating on the substrate 11 can be prevent from leaking, thereby improving the display effect.

In an embodiment of the present disclosure, a lateral width (in X direction as illustrated in FIG. 2) of the first light-emitting unit 13 is K1, and a vertical height (in Y direction as illustrated in FIG. 2) of the first light-emitting unit 13 is H. To guarantee that the light emitted by the first light-emitting unit 13 toward the substrate does not escape from the substrate, it is necessary to make an incident angle of the light emitted by the first light-emitting unit 13 passing through the edge of the light-blocking pattern on the substrate equal to 42 degrees (the light with a minimum incident angle on the substrate), at this time, total reflection occurs, and all the light is only reflected by the substrate, and no refraction occurs. At this time, a lateral width K2 of the first light-blocking pattern 12 is determined by the following equation K2=K1+2H*tan (42°). As long as the lateral width of the first light-blocking pattern 12 is greater than K2, the light emitted by the first light-emitting unit 13 will not escape from the substrate. In an embodiment of the present disclosure, the lateral width of the first light-emitting unit 13 ranges from 8 μm to 15 μm, the vertical height of the first light-emitting unit 13 is 5 μm, and the lateral width of the first light-blocking pattern 12 obtained according to the equation ranges from 17 μm to 24 μm. It should be noted that the lateral direction can be understood as a direction parallel to the plane where the substrate 11 is located, and the vertical direction can be understood as a direction perpendicular to the plane where the substrate 11 is located.

In some embodiments of the present disclosure, as illustrated in FIGS. 1 to 3, there are a plurality of first light-blocking patterns 12 and a plurality of first light-emitting units 13, the plurality of first light-blocking patterns 12 are arranged in array on the substrate 11, and the plurality of first light-emitting units 13 correspond to the plurality of first light-blocking patterns 12 in one-to-one correspondence, there are a plurality of encapsulation portions 14, and the plurality of encapsulation portions 14 correspond to the plurality of first light-blocking patterns 12 in one-to-one correspondence. It should be understood that a plurality of first light-emitting units 13 can be provided according to an area of the substrate 11 and a display area of a first light-emitting unit 13. And correspondingly, a plurality of first light-blocking patterns 12 may be provided corresponding to the plurality of first light-emitting units 13 in one-to-one correspondence, and a plurality of encapsulation portions 14 may be provided corresponding to the plurality of first light-emitting units 13 in one-to-one correspondence, thereby improving uniformity of display.

It should be noted that the first light-emitting unit 13 may be a micro LED, and each individual micro LED is encapsulated in an individual encapsulation portion 14. In the technology known to the inventors, no individual encapsulation portion is provided outside of a single micro LED. When the micro LED is adhered to the display panel by adhesive, as the micro LED and the wiring are disposed on a surface which contacts the adhesive, the surface is uneven, such that it is impossible for the adhesive to fit the surface completely and there are air bubbles in the adhesive, which are prone to display defects and backward light leakage problems. In the present disclosure, an individual encapsulation portion 14 is provided outside each independent micro LED.

In some embodiments of the present disclosure, the light source assembly 1 includes: a first light-emitting unit 13, a second light-emitting unit, and a third light-emitting unit. The first light-emitting unit 13, the second light-emitting unit, and the third light-emitting unit are respectively a light-emitting sub-unit R131, a light-emitting sub-unit G132, and a light-emitting sub-unit B133. There is a first black matrix between the first light-emitting unit and the substrate 11, and the first light-emitting unit and the first black matrix are encapsulated by a corresponding encapsulation part 14. There is a second black matrix between the second light-emitting unit and the substrate 11, and the second light-emitting unit and the second black matrix are encapsulated by a corresponding encapsulation part 14. And there is a third black matrix between the third light-emitting unit and the substrate 11, and the third light-emitting unit and the third black matrix are encapsulated by a corresponding encapsulation part 14.

In some embodiments of the present disclosure, as illustrated in FIGS. 2 and 3, the light source assembly 1 further includes a wiring 16. The wiring 16 is connected to the first light-emitting unit 13 and is configured to supply power to the first light-emitting unit 13.

In some embodiments of the present disclosure, the wiring 16 is made of a transparent conductive material. For example, the wiring 16 is made of indium tin oxide (ITO).

In some embodiments of the present disclosure, the wiring is made of conductive materials such as gold, silver, copper, aluminum and the like. In such a case, as illustrated in FIG. 3, the light source assembly 1 further includes a second light-blocking pattern 15, the second light-blocking pattern 15 is stacked with the substrate 11, and an orthographic projection of the second light-blocking pattern 15 on the substrate 11 and an orthographic projection of the first light-blocking pattern 12 on the substrate are spaced apart. A wiring 16 is stacked with the second light-blocking pattern 15 and disposed on a side of the second light-blocking pattern 15 away from the substrate 11. The wiring 16 is made of conductive materials such as gold, silver, copper, aluminum, and the like, and these materials are also of reflective. By providing the second shading pattern 15, a blocking characteristic of the second shading pattern 15 can be used to prevent ambient light from being incident on the wiring 16, thereby preventing the ambient light from being reflected by the wiring 16, thereby further improving the display effect of the display module 100. That the second light-blocking pattern 15 and the first light-blocking pattern 12 are spaced apart can be understood that the orthographic projection of the second light-blocking pattern 15 on the substrate 11 and an orthographic projection of the first light-blocking pattern 12 on the substrate 11 do not overlap.

In some embodiments of the present disclosure, the first light-emitting unit 13 may be a white micro LED. It can be understood that the white micro LED is an LED that can emit white light, so that an individual first light-emitting unit 13 can emit white light, thereby providing a light source for illuminating the display panel. In some embodiments of the present disclosure, the first light-emitting unit 13 may be a mini LED or a micro LED.

Figure 4:
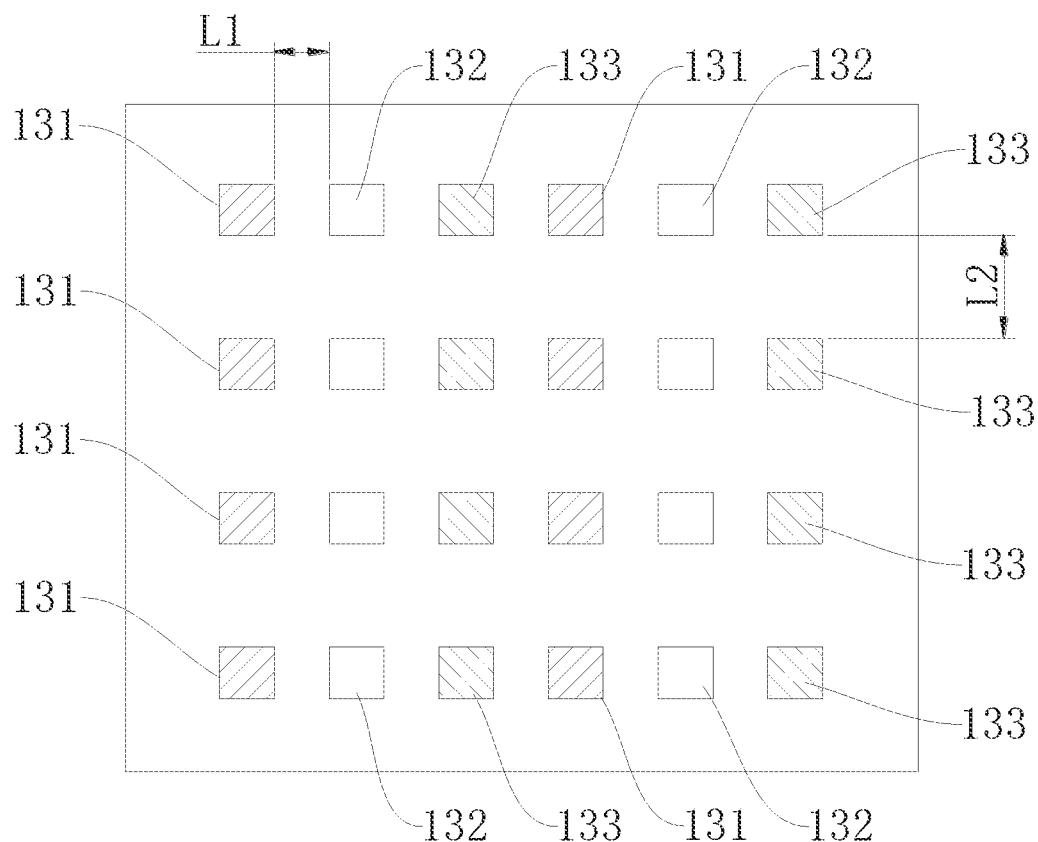
FIG. 4 illustrates a schematic view of a distribution of first light-emitting units of a light source assembly according to an embodiment of the present disclosure.
Figure 5:
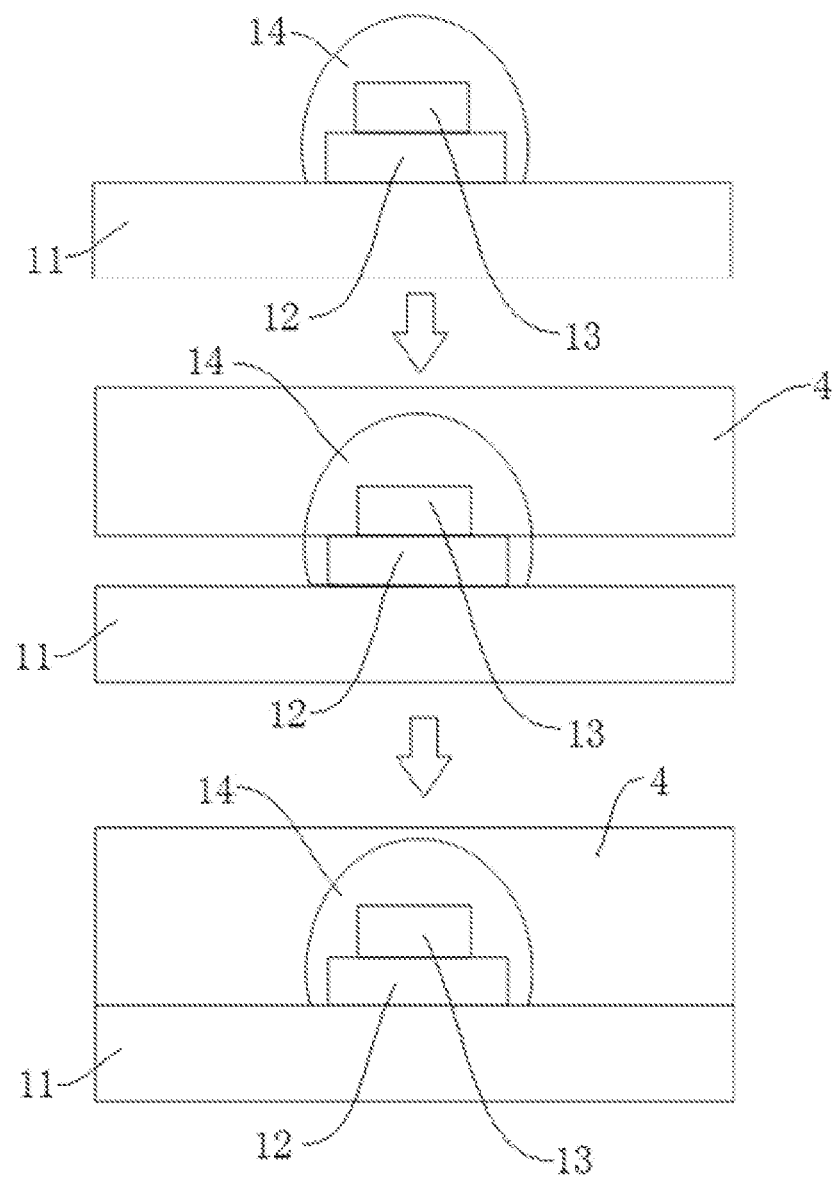
FIG. 5 illustrates a schematic structural view of a light source assembly bonded with an adhesive layer according to an embodiment of the present disclosure.

In some embodiments of the present disclosure, as illustrated in FIG. 4, the first light-emitting unit 13 includes three light-emitting sub-units R, G, and B, and a distance between two adjacent light-emitting sub-units of the first light-emitting unit 13 is L1 (L1 as illustrated in FIG. 5), and satisfies: 40 µm≤L1≤120 µm. It can be understood that the first light-emitting unit 13 includes three light-emitting sub-units that emit light of different colors. The three light-emitting sub-units are respectively a red light-emitting sub-unit R131, a green light-emitting sub-unit G132, and a blue light-emitting sub-unit B133. A distance between any two light-emitting sub-units, for example, a distance between is set between 40 µm and 120 µm, for example, between two adjacent light-emitting sub-units R131 and light-emitting sub-unit G132, between two adjacent light-emitting sub-units R131 and light-emitting sub-unit B133, or between two adjacent light-emitting sub-units G132 and the light-emitting sub-unit B133. Therefore, a better illuminating effect may be provided for the display panel. In an embodiment of the present disclosure, the distance between any two light-emitting sub-units can be determined according to the specs of the light-emitting sub-units. For example, in an embodiment of the present disclosure, the distance between any two adjacent light-emitting sub-units may be 40 µm, 50 µm, 60 µm, 70 µm, 80 µm, 90 µm, 100 µm, 110 µm, or 120 µm.

It should be noted that the light-emitting sub-unit R131, the light-emitting sub-unit G132, and the light-emitting sub-unit B133 can be combined according to various output percentages, and thus the light-emitting sub-unit R131, the light-emitting sub-unit G132, and the light-emitting unit B133 can be combined into any color, so that the first light-emitting unit 13 renders different colors.

In some embodiments of the present disclosure, as illustrated in FIG. 4, the distance between two identical light-emitting sub-units in two adjacent first light-emitting units 13 is L2 (L2 as illustrated in FIG. 4), and satisfies: 120 µm≤L2≤360 µm. As a result, mutual influence between same light-emitting sub-units of two adjacent first light-emitting units 13 can be reduced, so that the illuminating effect can be improved. In an embodiment of the present disclosure, a distance between same light-emitting sub-units respectively located in two adjacent first light-emitting units 13 can be determined according to specs of the light-emitting sub-units. For example, in an embodiment of the present disclosure, the distance between same light-emitting sub-units of two adjacent first light-emitting units 13 may be 120 µm, 150 µm, 180 µm, 210 µm, 240 µm, 270 µm, 300 µm, 330 µm or 360 µm. It should be noted that the identical light-emitting sub-units of the two adjacent first light-emitting units 13 only refer to the two light-emitting sub-units of same color with the shortest distance.

FIG. 5 illustrates a schematic view when the light source assembly according to the present disclosure is bonded with an adhesive layer. As illustrated in FIG. 5, since the outer surface of the encapsulation portion 14 is formed into a hemispherical surface or a spherical crown surface, the hemispherical surface or spherical crown surface is derivable everywhere, the outer surface of the encapsulation portion 41 can be fully adhered to the adhesive layer 4, so that air bubbles can be avoided.

At least one embodiment of the present disclosure further provides a method of manufacturing a light source assembly.

Figure 6:
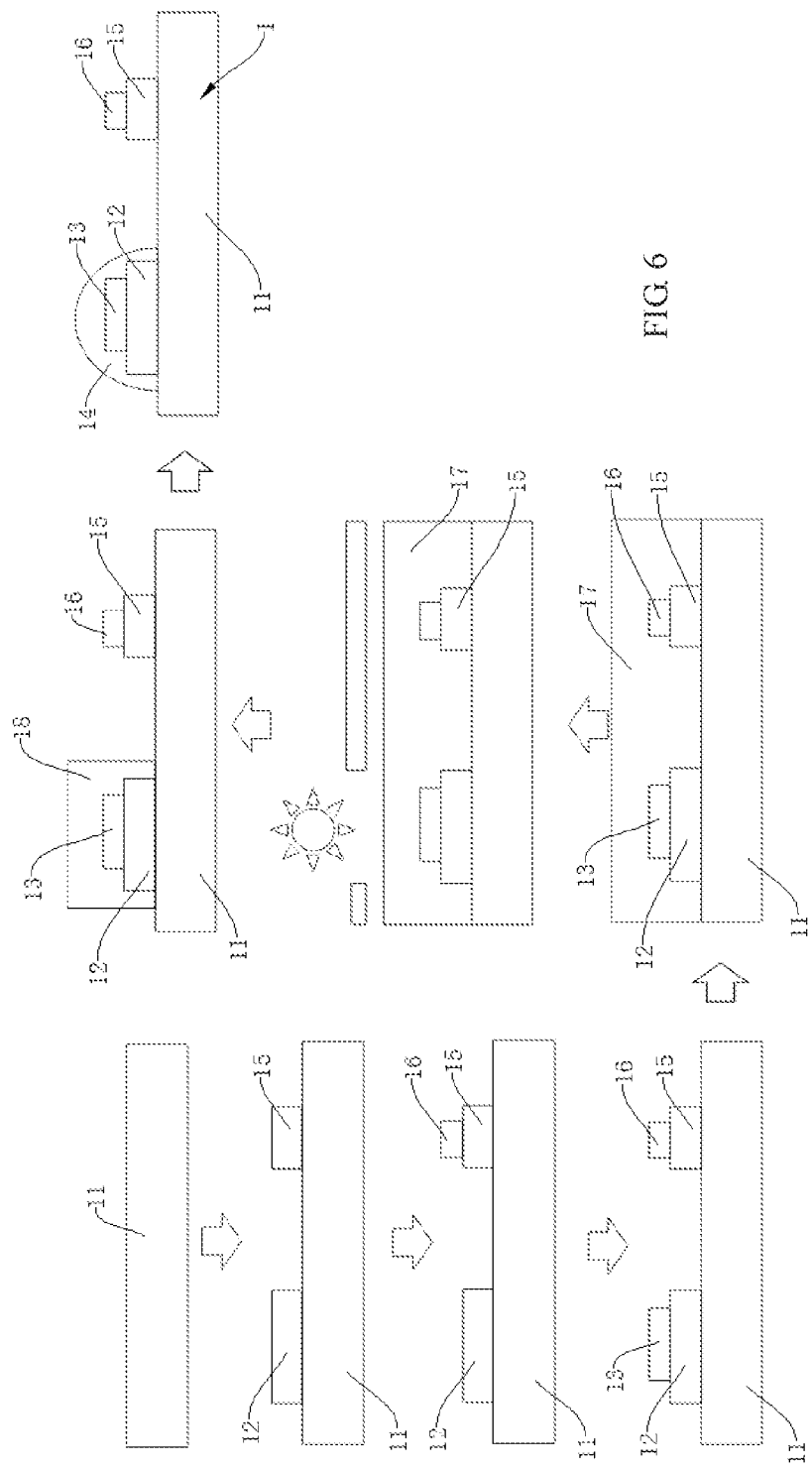
FIG. 6 illustrates a flow chart of a method of manufacturing a light source assembly according to an embodiment of the present disclosure.

FIG. 6 illustrates a flowchart of a method of manufacturing a light source assembly according to an embodiment of the present disclosure. As illustrated in FIG. 6, when a light source assembly is manufactured, a first light-blocking pattern 12 is first formed on a side of the substrate 11, and then a first light-emitting unit 13 is formed on a side of the first light-blocking pattern 12 away from the substrate 11. Next, in a vacuum environment, encapsulation material is slowly spin-coated on surfaces of the first light-emitting unit 13 and the first light-blocking pattern 12 to ensure that each first light-emitting unit 13 and the first light-blocking pattern 12 are encapsulated without bubbles, so as to form a basic encapsulation layer. Subsequently, photoresist is coated and exposed at a position corresponding to each first light-emitting unit 13 through a mask (mask) to form an encapsulation embryonic portion that envelops the first light-emitting unit 13 and the first light-blocking pattern 12. Then, the encapsulation embryonic portion is melt through a reflow soldering process so as to form an encapsulation portion 14 with a curved surface.

In an embodiment of the present disclosure, the first light-emitting unit 13 may be a micro LED or a mini LED, and the size of the first light-emitting unit 13 is about 1 μm to 10 μm.

In an embodiment of the present disclosure, orthographic projections of the first light-blocking pattern 12 and the first light-emitting unit 13 on the substrate 11 are located within an orthographic projection of the encapsulation portion 14 on the substrate 11.

In an embodiment of the present disclosure, the encapsulation material is spin-coated on the surface of the first light-blocking pattern and the first light-emitting unit in a vacuum environment.

In some embodiments of the present disclosure, the encapsulation embryonic portion has one of a cylindrical structure and a truncated cone-shaped encapsulation structure.

Through the method of manufacturing the light source assembly according to the embodiment of the present disclosure, the first light-emitting unit 13 and the first light-blocking pattern 12 are encapsulated in the encapsulation portion 14, and the outer surface of the encapsulation part 14 is formed into a curved surface. When the light source assembly 1 is adhered to the adhesive layer 4, the encapsulation portion 14 with a curved outer surface can be fully adhered to the adhesive layer 4, thereby avoiding air bubbles, thereby preventing the display module 100 from display defects, and further improving the display effect of the display module 100. In addition, the first light-blocking pattern 12 disposed between the first light-emitting unit 13 and the substrate 11 can block light emitted by the first light-emitting unit 13 towards the substrate with a small incident angle, so as to prevent the light emitted by the first light-emitting unit 13 from leaking at the substrate, thereby further improving the display effect of the display module 100.

At least one embodiment of the present disclosure further provides a display module.

Figure 7:
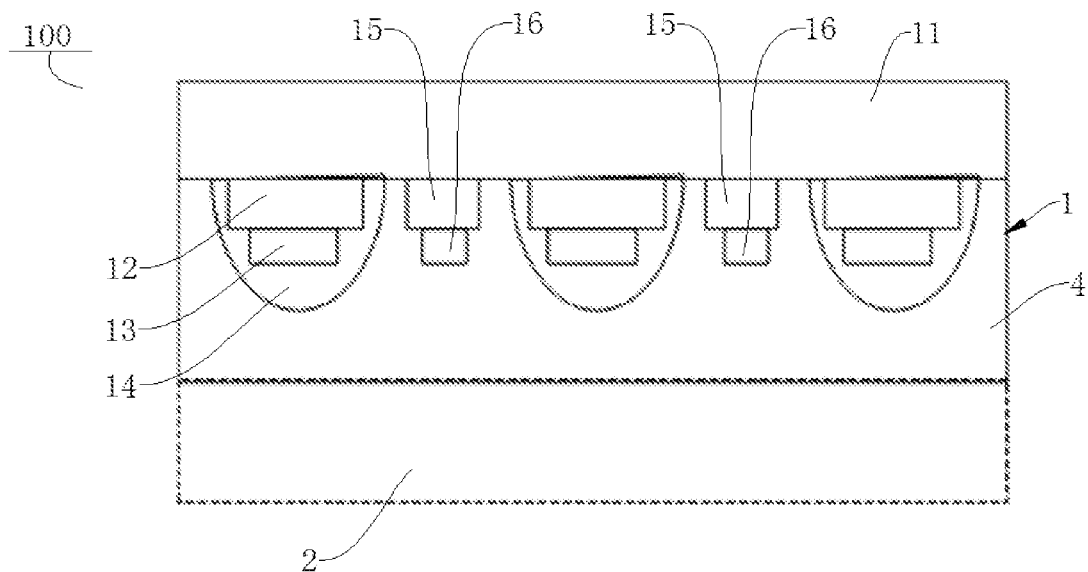
FIG. 7 illustrates a schematic structural view of a display module according to an embodiment of the present disclosure.

As illustrated in FIG. 7, a display module 100 according to an embodiment of the present disclosure includes: a reflective panel 2 and a light source assembly 1. The light source assembly 1 and the reflective panel 2 are bonded by an adhesive layer 4, and a first light-emitting unit 13 is located between the reflective panel 2 and the substrate 11.

It should be understood that under a condition of sufficient external light, the external light can pass through the substrate 11 and irradiate on the reflective panel 2. After being reflected by the reflective panel 2, it can be reflected toward the substrate 11, thereby providing a backlight source for the display module 100. Under a condition of insufficient external light, the light source assembly 1 can be turned on, and the first light-emitting unit 13 can be configured to emit light to the reflective panel 2, and then after being reflected by the reflective panel 2, the light can be reflected toward the substrate 11, thereby providing a backlight source for the display module 100.

In the display module 100 according to the embodiment of the present disclosure, by encapsulating the first light-emitting unit 13 and the first light-blocking pattern 12 in the encapsulation portion 14 which has a curved outer surface, when the light source assembly 1 is bonded with the adhesive layer 4, the encapsulation portion 14 with a curved outer surface can be fully adhered to the adhesive layer 4. Thus, air bubble can be avoided and display defects of the display module 100 can be prevented, thereby improving the display effect of the display module 100. In addition, the first light-blocking pattern 12 is provided between the first light-emitting unit 13 and the substrate 11. Due to its light-blocking characteristic, the first light-blocking pattern 12 can be configured to block the light emitted by the first light-emitting unit 13 toward the substrate 11 with a small incident angle, thereby preventing the light emitted by the first light-emitting unit 13 from leaking at the substrate 11 and further improving the display effect of the display module 100.

In some embodiments of the present disclosure, the reflective panel 2 is a reflective LCD or a reflective electronic ink screen. Therefore, a reflective LCD or a reflective electronic ink screen can be provided according to user needs, so as to meet the needs of users better. For example, the reflective electronic ink screen may be a monochrome reflective electronic ink screen or a color reflective electronic ink screen.

Figure 8:
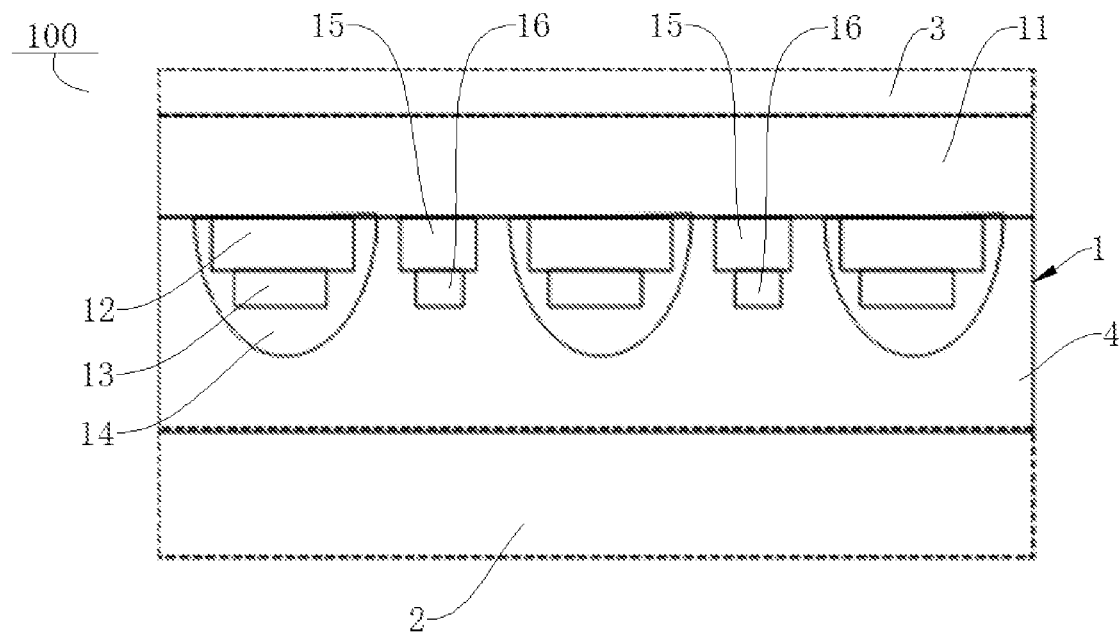
FIG. 8 illustrates a schematic structural view of a display module according to another embodiment of the present disclosure.

In some embodiments of the present disclosure, as illustrated in FIG. 8, the reflective panel 2 is a reflective LCD, and the display module 100 further includes: an anti-reflection polarizer 3 which is stacked with the substrate 11 and disposed on a side of the substrate 11 away from the first light-blocking pattern 12, wherein a polarization direction of the anti-reflection polarizer 3 is the same as that of the reflective LCD. It can be understood that the anti-reflection polarizer 3 can attenuate light that is directly emitted outward and is not reflected by the reflective LCD, so that the display effect of the display module 100 can be further improved. For example, in an embodiment of the present disclosure, the reflective LCD further includes an anti-reflection polarizer 3 facing a front light source. The polarization direction of the anti-reflection polarizer 3 is same as the polarization direction of light emitted by the reflective LCD, that is, being same as the polarization direction of the anti-reflection polarizer 3 disposed on a side of the reflective LCD facing the front light source.

In some embodiments of the present disclosure, the refractive index d2 of the adhesive layer 4 satisfies: 1.4≤d2≤1.6. It can be understood that setting the refractive index of the adhesive layer 4 as 1.4-1.6 can reduce a difference between the refractive index of the adhesive layer 4 and a refractive index of the substrate 11, thereby providing a better display effect. For example, in an embodiment of the present disclosure, the refractive index of the adhesive layer 4 may be 1.42, 1.44, 1.46, 1.49, 1.51, 1.53, 1.55, 1.57, or 1.59. It can be determined according to the refractive index of the substrate 11. In addition, in an embodiment of the present disclosure, a refractive index of the encapsulation part 14 is equal to the refractive index of the adhesive layer 4.

In the present disclosure, unless otherwise clearly defined and stated, the terms "installed", "connected", "linked", "fixed" and other terms should be understood in a broad sense. For example, it may be a fixed connection, a detachable connection, or an integrated connection. It may be a direction connection or an indirection connection with an intermediate medium, or it may be an internal communication of two components or an interaction relationship between two components. For those of ordinary skill in the art, the specific meaning of the above-mentioned terms in the present disclosure can be understood according to specific circumstances.

In the description of this specification, descriptions with reference to the terms "an embodiment", "some embodiments", "examples", "specific examples", or "some examples" etc. mean that specific features, structures, materials or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, one ordinary skill in the art can combine and combine various embodiments or examples and the features of various embodiments or examples described in this specification without contradicting each other.

Although the embodiments of the present disclosure have been illustrated and described, one of ordinary skill in the art can understand that various changes, modifications, substitutions, and modifications can be made to these embodiments without departing from the principle and gist of the present disclosure. The scope of the present disclosure is defined by the appended claims and their equivalents.

The invention claimed is:

1. A light source assembly, comprising:
   a substrate;
   a first light-blocking pattern disposed on the substrate;
   a first light-emitting unit disposed on the first light-blocking pattern; and
   an encapsulation portion disposed on the substrate and enveloping the first light-blocking pattern and the first light-emitting unit;
   wherein an outer surface of the encapsulation portion is a curved surface.

2. The light source assembly according to claim 1, wherein the light source assembly is applicable to a reflective display module.

3. The light source assembly according to claim 1, wherein orthographic projections of the first light-blocking pattern and the first light-emitting unit on the substrate are located within an orthographic projection of the encapsulation portion on the substrate.

4. The light source assembly according to claim 1, wherein the curved surface is a hemispherical surface or a spherical crown surface.

5. The light source assembly according to claim 1, wherein an orthographic projection of the first light-emitting unit on the substrate is located within an orthographic projection of the first light-blocking pattern on the substrate, and an angle between light that is emitted by the first light-emitting unit towards the substrate and is blocked by an edge of the first light-blocking pattern and a central axis of the first light-emitting unit is not less than 42°.

6. The light source assembly according to claim 1, wherein the first light-emitting unit comprises three light-emitting sub-units of different colors, and a distance between two adjacent light-emitting sub-units of the first light-emitting unit ranges from 40 μm to 120 μm.

7. The light source assembly according to claim 1, wherein the first light-emitting unit is a white light micro LED.

8. The light source assembly according to claim 1, further comprising a first wiring disposed on the substrate, wherein the first wiring is connected to the first light-emitting unit, and the first wiring is made of a transparent conductive material.

9. The light source assembly according to claim 1, further comprising:
   a second light-blocking pattern disposed on the substrate, wherein an orthographic projection of the second light-blocking pattern on the substrate is spaced apart from an orthographic projection of the first light-blocking pattern on the substrate; and
   a second wiring disposed on the second light-blocking pattern, wherein the second wiring is made of a metal material and is connected to the first light-emitting unit.

10. The light source assembly according to claim 1, wherein a refractive index of the encapsulation portion ranges from 1.4 to 1.6.

11. The light source assembly of claim 1, wherein there are a plurality of the first light-blocking patterns, the plurality of first light-blocking patterns are arranged in array on the substrate, and there are a plurality of the first light-emitting units, the plurality of first light-emitting units correspond to the plurality of first light-blocking patterns in one-to-one correspondence, and there are a plurality of the encapsulation portions and the plurality of encapsulation portions correspond to the plurality of first light-blocking patterns in one-to-one correspondence.

12. The light source assembly according to claim 11, wherein the first light-emitting unit comprises a red light-emitting sub-unit, a green light-emitting sub-unit, and a blue light-emitting sub-unit, and a distance between two light-emitting sub-units with a same color of two adjacent first light-emitting units ranges from 120 μm to 360 μm.

13. A display module, comprising:
   a reflective panel; and
   the light source assembly according to claim 1; wherein the light source assembly and the reflective panel are bonded by an adhesive layer, and the first light-emitting unit is located between the reflective panel and the substrate.

14. The display module according to claim 13, wherein the reflective panel is a reflective electronic ink screen.

15. The display module according to claim 13, wherein the reflective panel is a reflective LCD, and the display module further comprises:
   an anti-reflection polarizer stacked with the substrate and disposed on a side of the substrate away from the first light-blocking pattern, wherein a polarization direction of the anti-reflection polarizer is same as a polarization direction of the reflective LCD.

16. The display module according to claim 13, wherein a refractive index of the adhesive layer ranges from 1.4 to 1.6.

17. The display module according to claim 16, wherein a refractive index of the encapsulation portion is equal to the refractive index of the adhesive layer.

18. A method of manufacturing a light source assembly, comprising:
   forming a first light-blocking pattern on a substrate;
   forming a first light-emitting unit on the first light-blocking pattern;
   spin-coating an encapsulation material on surfaces of the first light-blocking pattern and the first light-emitting unit to form a basic encapsulation layer;
   patterning the basic encapsulation layer to form an encapsulation embryonic portion; and
   processing an outer surface of the encapsulation embryonic portion by a reflow process to form an encapsulation portion, wherein an outer surface of the encapsulation portion is a curved surface.

19. The method according to claim 18, wherein spin-coating the encapsulation material on the surfaces of the first light-blocking pattern and the first light-emitting unit is performed in a vacuum environment.

20. The method according to claim 18, wherein the encapsulation embryonic portion has one structure of a cylindrical encapsulation structure and a truncated cone-shaped encapsulation structure.

* * * * *